United States Patent
Kumar et al.

(10) Patent No.: US 7,446,261 B2
(45) Date of Patent: Nov. 4, 2008

(54) FLEXIBLE CIRCUIT BOARDS WITH TOOLING CUTOUTS FOR OPTOELECTRONIC MODULES

(75) Inventors: Dev E. Kumar, San Mateo, CA (US); Donald A. Ice, Milpitas, CA (US); Kinya Nippa, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/835,832

(22) Filed: Apr. 30, 2004

(65) Prior Publication Data

US 2005/0045374 A1 Mar. 3, 2005

Related U.S. Application Data

(63) Continuation-in-part of application No. 10/409,837, filed on Apr. 9, 2003, which is a continuation-in-part of application No. 10/231,395, filed on Aug. 29, 2002, now Pat. No. 6,703,561, and a continuation-in-part of application No. 10/101,260, filed on Mar. 18, 2002, now Pat. No. 6,868,104, which is a continuation-in-part of application No. 10/077,067, filed on Feb. 14, 2002, now Pat. No. 6,586,678.

(60) Provisional application No. 60/317,835, filed on Sep. 6, 2001.

(51) Int. Cl.
*H05K 1/00* (2006.01)

(52) U.S. Cl. ........................ 174/254; 174/255; 361/759; 361/751; 361/777; 361/778

(58) Field of Classification Search ................. 174/254, 174/255; 361/759, 751, 777–778
See application file for complete search history.

(56) References Cited

U.S. PATENT DOCUMENTS 3,271,214 A * 9/1966 Tabor ........................ 156/52

(Continued)

FOREIGN PATENT DOCUMENTS

GB 0881671 12/1998

(Continued)

OTHER PUBLICATIONS

Murata, S., Nishimura, K., *Improvement in Thermal Properties of a Multi-Beam Laser Diode Array*, Japanese Journal of Applied Physics, vol. 28, Suppl. 28-3, pp. 165-170 (1989).

(Continued)

*Primary Examiner*—Jeremy C. Norris
*Assistant Examiner*—Hoa C Nguyen
(74) *Attorney, Agent, or Firm*—Workman Nydegger

(57) ABSTRACT

A flexible circuit comprises a flexible substrate having first and second opposing surfaces. The flexible substrate can include multiple layers. A plurality of electrical traces can be mounted on either or both surfaces of the flexible substrate. A plurality of electrical components can also be mounted on either or both surfaces of the flexible substrate. A plurality of tooling cutouts is recessed in the sides of the flexible circuit. The tooling cutouts can have various shapes, such as, but not limited to, semi-circular, multiple straight edges, a single or multiple curved edges, etc. The cutouts are used to position and hold the flexible circuit in at least one other device.

22 Claims, 5 Drawing Sheets

U.S. PATENT DOCUMENTS

| | | |
|---|---|---|
| 3,629,787 A | 12/1971 | Wilson |
| 3,987,676 A | 10/1976 | Bennewitz |
| 4,011,980 A | 3/1977 | Dvorak et al. |
| 4,092,061 A | 5/1978 | Stigliani, Jr. |
| 4,128,697 A | 12/1978 | Simpson |
| 4,162,817 A | 7/1979 | Briggs et al. |
| 4,179,802 A | 12/1979 | Joshi et al. |
| 4,295,696 A | 10/1981 | Gray |
| 4,375,578 A | 3/1983 | Mitchell et al. |
| 4,435,031 A | 3/1984 | Black et al. |
| 4,435,740 A | 3/1984 | Huckabee et al. |
| 4,769,684 A | 9/1988 | Crocker et al. |
| 4,815,990 A | 3/1989 | Ristedt et al. |
| 4,818,099 A | 4/1989 | Preikschat et al. |
| 4,952,016 A | 8/1990 | Adams et al. |
| 4,953,006 A | 8/1990 | Kovats et al. |
| 4,962,991 A | 10/1990 | Carvalho |
| 4,973,211 A | 11/1990 | Potucek |
| 5,044,980 A | 9/1991 | Krumme et al. |
| 5,125,054 A | 6/1992 | Ackley et al. |
| 5,136,682 A | 8/1992 | Moyer et al. |
| 5,159,535 A | 10/1992 | Desai et al. |
| 5,212,345 A | 5/1993 | Gutierrez |
| 5,249,245 A | 9/1993 | Lebby et al. |
| 5,253,311 A | 10/1993 | Killen et al. |
| 5,262,590 A | 11/1993 | Lia |
| 5,299,276 A | 3/1994 | Okamura et al. |
| 5,343,360 A | 8/1994 | Sanwo |
| 5,359,686 A | 10/1994 | Galloway et al. |
| 5,361,317 A | 11/1994 | Hartman et al. |
| 5,371,820 A | 12/1994 | Welbourn et al. |
| 5,371,822 A | 12/1994 | Horwitz et al. |
| 5,375,184 A | 12/1994 | Sullivan |
| 5,389,686 A | 2/1995 | Diop et al. |
| 5,409,384 A | 4/1995 | Green et al. |
| 5,414,786 A | 5/1995 | Ohta et al. |
| 5,420,954 A | 5/1995 | Swirhun et al. |
| 5,428,190 A | 6/1995 | Stopperan |
| 5,432,630 A | 7/1995 | Lebby et al. |
| 5,452,182 A | 9/1995 | Eichelberger et al. |
| 5,462,441 A | 10/1995 | Renn et al. |
| 5,471,552 A | 11/1995 | Wuu et al. |
| 5,474,463 A | 12/1995 | Robinson et al. |
| 5,479,288 A | 12/1995 | Ishizuka et al. |
| 5,495,125 A | 2/1996 | Uemura |
| 5,499,312 A | 3/1996 | Hahn et al. |
| 5,539,848 A | 7/1996 | Galloway |
| 5,545,846 A | 8/1996 | Williams et al. |
| 5,596,662 A | 1/1997 | Boscher |
| 5,613,024 A | 3/1997 | Shahid |
| 5,625,734 A | 4/1997 | Thomas et al. |
| 5,638,469 A | 6/1997 | Feldman et al. |
| 5,666,449 A | 9/1997 | Sawae et al. |
| 5,703,895 A | 12/1997 | Ghirardi et al. |
| 5,706,378 A | 1/1998 | Suzuki et al. |
| 5,717,800 A | 2/1998 | Funabashi |
| 5,733,151 A | 3/1998 | Edsall et al. |
| 5,752,851 A | 5/1998 | Zaderej et al. |
| 5,774,614 A | 6/1998 | Gilliland et al. |
| 5,788,143 A | 8/1998 | Boyd et al. |
| 5,844,783 A | 12/1998 | Kojima |
| 5,894,409 A * | 4/1999 | Tanaka ...................... 361/749 |
| 5,974,214 A | 10/1999 | Shacklette et al. |
| 5,996,222 A | 12/1999 | Shangguan et al. |
| 6,010,359 A | 1/2000 | Etters et al. |
| 6,011,695 A | 1/2000 | Dumke |
| 6,017,222 A | 1/2000 | Kao |
| 6,039,600 A | 3/2000 | Etters et al. |
| 6,040,624 A * | 3/2000 | Chambers et al. ........... 257/692 |
| 6,043,990 A | 3/2000 | Johnson et al. |
| 6,045,269 A | 4/2000 | Watanabe et al. |
| 6,069,991 A | 5/2000 | Hibbs-Brenner et al. |
| 6,088,498 A | 7/2000 | Hibbs-Brenner et al. |
| 6,091,475 A | 7/2000 | Ogino et al. |
| 6,118,072 A | 9/2000 | Scott |
| 6,118,666 A * | 9/2000 | Aoki et al. ................... 361/749 |
| 6,162,065 A | 12/2000 | Benham |
| 6,181,011 B1 | 1/2001 | Rostoker et al. |
| 6,195,261 B1 * | 2/2001 | Babutzka et al. ............ 361/752 |
| 6,268,231 B1 | 7/2001 | Wetzel |
| 6,294,255 B1 | 9/2001 | Suzuki et al. |
| 6,300,164 B1 | 10/2001 | Call et al. |
| 6,305,848 B1 | 10/2001 | Gregory |
| 6,326,553 B1 * | 12/2001 | Yim et al. .................... 174/254 |
| 6,350,063 B1 | 2/2002 | Gilliland et al. |
| 6,380,493 B1 * | 4/2002 | Morita et al. ................ 174/258 |
| 6,404,960 B1 | 6/2002 | Hibbs-Brenner et al. |
| 6,439,918 B1 | 8/2002 | Togami et al. |
| 6,473,314 B1 | 10/2002 | Custer et al. |
| 6,483,712 B1 | 11/2002 | Oliphant et al. |
| 6,485,322 B1 | 11/2002 | Branch et al. |
| 6,521,989 B2 | 2/2003 | Zhou |
| 6,537,082 B2 | 3/2003 | Hopfer, III et al. |
| 6,580,739 B1 | 6/2003 | Coldren |
| 6,586,678 B1 | 7/2003 | Rosenberg et al. |
| 6,617,518 B2 * | 9/2003 | Ames et al. .................. 174/254 |
| 6,624,000 B1 | 9/2003 | Coldren |
| 6,700,079 B2 | 3/2004 | Bogursky et al. |
| 6,703,561 B1 | 3/2004 | Rosenberg et al. |
| 6,709,607 B2 | 3/2004 | Hibbs-Brenner et al. |
| 6,734,658 B1 | 5/2004 | Bierer |
| 6,767,220 B2 | 7/2004 | Wilson et al. |
| 6,769,920 B1 | 8/2004 | Mease et al. |
| 6,781,727 B2 | 8/2004 | Auracher et al. |
| 6,800,169 B2 | 10/2004 | Liu et al. |
| 6,809,905 B2 | 10/2004 | Kilmer |
| 6,812,803 B2 | 11/2004 | Goergen |
| 6,841,733 B2 | 1/2005 | Schiaffino et al. |
| 6,852,928 B2 | 2/2005 | Giaretta et al. |
| 6,860,649 B2 | 3/2005 | Edwards et al. |
| 6,863,453 B2 | 3/2005 | Wang et al. |
| 6,867,368 B2 | 3/2005 | Kumar et al. |
| 6,867,377 B2 | 3/2005 | Anderson et al. |
| 6,878,875 B2 | 4/2005 | Aronson et al. |
| 6,911,599 B2 | 6/2005 | Rosenberg et al. |
| 6,947,672 B2 | 9/2005 | Jiang et al. |
| 6,996,304 B2 | 2/2006 | Aronson et al. |
| 7,010,233 B2 | 3/2006 | Lindblad |
| 7,066,659 B2 | 6/2006 | Aronson et al. |
| 7,275,937 B2 | 10/2007 | Ellison |
| 7,311,240 B2 | 12/2007 | Nippa et al. |
| 2001/0017376 A1 | 8/2001 | Verdiell |
| 2002/0136501 A1 | 9/2002 | Yen et al. |
| 2002/0170742 A1 | 11/2002 | Liaw et al. |
| 2002/0181895 A1 | 12/2002 | Gilliland et al. |
| 2003/0102157 A1 | 6/2003 | Rosenberg et al. |
| 2003/0197254 A1 | 10/2003 | Huang |
| 2004/0018409 A1 | 1/2004 | Hui et al. |
| 2004/0062491 A1 | 4/2004 | Sato et al. |
| 2004/0090620 A1 | 5/2004 | Farr |
| 2004/0092135 A1 | 5/2004 | Hofmeister et al. |
| 2004/0151505 A1 | 8/2004 | Aronson et al. |
| 2004/0202214 A1 | 10/2004 | Aronson et al. |
| 2005/0018409 A1 | 1/2005 | Hirakata |
| 2005/0045374 A1 | 3/2005 | Kumar |
| 2005/0130488 A1 | 6/2005 | Zhu et al. |
| 2005/0244095 A1 | 11/2005 | Ellison |
| 2005/0245103 A1 | 11/2005 | Ellison |
| 2005/0245118 A1 | 11/2005 | Liu et al. |
| 2005/0265650 A1 | 12/2005 | Priyadarshi et al. |
| 2006/0032665 A1 | 2/2006 | Ice |

2006/0062526 A1   3/2006   Ikeuchi

FOREIGN PATENT DOCUMENTS

| GB | 0905838 | 3/1999 |
|---|---|---|
| JP | 61-071689 | 4/1986 |
| JP | 62-114545 | 5/1987 |
| JP | 63-136680 | 6/1988 |
| JP | 01-169986 | 5/1989 |
| JP | 02-240989 | 9/1990 |
| JP | 03-0148190 | 6/1991 |
| JP | 406034838 | 2/1994 |
| JP | 407159636 | 6/1995 |
| JP | 09-223848 | 8/1997 |
| JP | 2000228006 | 8/2000 |
| WO | PCT/US92/00538 | 1/1992 |

OTHER PUBLICATIONS

U.S. Appl. No. 10/409,837, filed Apr. 9, 2003, Kumar et al.
U.S. Appl. No. 10/687,107, filed Oct. 16, 2003, Aronson et al.
U.S. Appl. No. 11/094,990, filed Mar. 31, 2005, Liu et al.
U.S. Appl. No. 11/179,223, filed Jul. 11, 2005, Ice.
Ali, "New Materials and Design Components for Integrated Optics," Technology Report/Fiberoptics, Laser Focus World, vol. 21, No. 8, Aug. 1985.
Cohen, "Passive Laser-Fiber Alignment by Index Method," IEEE Photonics Technology Letters, vol. 3, No. 11, Dec. 1991, pp. 985-987, New York, U.S.
Coldren, et al., "Flip-Chip Bonded, Back-Emitting, Microlensed Arrays of Monolithic Vertical Cavity Lasers and Resonant Photodetectors," Electronic Components and Technology Conference, Sep. 1999, pp. 733-740.
Havant, "Flexible Interposing Carrier Scheme for Optical Waveguides," Research Disclosure No. 303, Jul. 1989, p. 512.
Hibbs-Brenner, et al., "Packaging of VCSEL Arrays for Cost-Effective Interconnects at <10 Meters," Electronic Components and Technology Conference, Sep. 1999, pp. 747-752.
Hsu, et al., "Flip-Chip Approach to Endfire Coupling Between Single-Mode Optical Fibers and Channel Waveguides," Patent Associates Literature, Electronic Letters, vol. 12, No. 16, pp. 404-405, Aug. 5, 1976.
Kazlas, et al., "Monolithic Vertical-Cavity Laser/p-i-n Photodiode Transceiver Array for Optical Interconnects," IEEE Photonics Technology Letters, Nov. 1998, pp. 1530-1532, vol. 10, No. 11.
Louderback, et al., "Flip Chip Bonded Arrays of Monolithically Integrated, Microlensed Vertical-Cavity Lasers and Resonant Photodetectors," IEEE Photonics Technology Letters, Mar. 1999, pp. 304-306, vol. II. No. 3.
Plawsky, et al., "Photochemically Machined, Glass Ceramic, Optical Fiber Interconnection Components," Article, Optoelectronic Materials, Devices, Packaging and Interconnects (1998), SPIE, vol. 994, pp. 101-106.
Sullivan, et al., "Polymeric Waveguides," 1992 IEEE, pp. 27-31.
U.S. Appl. No. 10/231,395, filed Sep. 24, 2003, Notice of Allowance.
U.S. Appl. No. 10/629,253, filed Feb. 24, 2005, Office Action.
U.S. Appl. No. 10/629,253, filed Oct. 4, 2005, Office Action.
U.S. Appl. No. 10/629,253, filed Feb. 3, 2006, Notice of Allowance.
U.S. Appl. No. 10/629,724, filed Sep. 22, 2004, Notice of Allowance.
U.S. Appl. No. 10/409,837, filed Jun. 15, 2005, Office Action.
U.S. Appl. No. 10/409,837, filed Oct. 31, 2005, Office Action.
U.S. Appl. No. 10/409,837, filed May 26, 2006, Office Action.
U.S. Appl. No. 10/409,837, filed Nov. 14, 2006, Office Action.
U.S. Appl. No. 10/409,837, filed May 17, 2007, Office Action.
U.S. Appl. No. 10/409,837, filed Dec. 7, 2007, Office Action.
U.S. Appl. No. 10/748,051, filed May 27, 2004, Office Action.
U.S. Appl. No. 10/748,051, filed Dec. 3, 2004, Notice of Allowance.
U.S. Appl. No. 10/795,597, filed Aug. 25, 2004, Notice of Allowance.
U.S. Appl. No. 10/795,597, filed Jan. 26, 2005, Notice of Allowance.
U.S. Appl. No. 11/029,067, filed Jun. 29, 2005, Notice of Allowance.
U.S. Appl. No. 10/687,107, filed Oct. 6, 2006, Office Action.
U.S. Appl. No. 10/687,107, filed Apr. 10, 2007, Office Action.
U.S. Appl. No. 10/687,107, filed Oct. 17, 2007, Office Action.
U.S. Appl. No. 10/836,728, filed Jul. 19, 2005, Office Action.
U.S. Appl. No. 10/836,728, filed Jan. 18, 2006, Office Action.
U.S. Appl. No. 10/836,728, filed May 5, 2006, Office Action.
U.S. Appl. No. 10/836,728, filed Jan. 16, 2007, Office Action.
U.S. Appl. No. 10/836,728, filed May 30, 2007, Notice of Allowance.
U.S. Appl. No. 10/836,728, filed Jul. 25, 2007, Notice of Allowance.
U.S. Appl. No. 10/795,597, filed Aug. 25, 2004, Notice of Allowance.
U.S. Appl. No. 10/795,597, filed Jan. 26, 2005, Notice of Allowance.
U.S. Appl. No. 10/836,129, filed Mar. 13, 2006, Office Action.
U.S. Appl. No. 10/836,129, filed Aug. 10, 2007, Notice of Allowance.
U.S. Appl. No. 11/029067, filed Jun. 29, 2005, Notice of Allowance.
U.S. Appl. No. 11/094,990, filed Mar. 28, 2006, Office Action.
U.S. Appl. No. 11/094,990, filed Oct. 12, 2006, Office Action.
U.S. Appl. No. 11/094,990, filed Apr. 5, 2007, Office Action.
U.S. Appl. No. 11/094,990, filed Dec. 6, 2007, Office Action.
U.S. Appl. No. 11/094,990, filed May 6, 2008, Notice of Allowance.
U.S. Appl. No. 11/179,223, filed Feb. 23, 2007, Office Action.
U.S. Appl. No. 11/179,223, filed Nov. 19, 2007, Office Action.

* cited by examiner

FLEXIBLE CIRCUIT BOARDS WITH TOOLING CUTOUTS FOR OPTOELECTRONIC MODULES

CROSS-REFERENCE TO RELATED APPLICATIONS

This application is a continuation-in-part of U.S. patent application Ser. No. 10/409,837, filed on Apr. 9, 2003, and entitled "Flexible Circuit for Establishing Electrical Connectivity with Optical Subassembly", which is a continuation-in-part of U.S. patent application Ser. No. 10/231,395, filed Aug. 29, 2002, now U.S. Pat. No. 6,703,561 entitled "Header Assembly Having Integrated Cooling Device, which is a continuation-in-part of U.S. patent application Ser. No. 10/077,067, filed Feb. 14, 2002, now U.S. Pat. No. 6,586,678 entitled "Ceramic Header Assembly, now U.S. Pat. No. 6,586,678, and U.S. patent application Ser. No. 10/101,260, filed Mar. 18, 2002, now U.S. Pat. No. 6,868,104 entitled "Compact Laser Package with Integrated Temperature Control," which in turn claims the benefit of U.S. Provisional Patent Application Ser. No. 60/317,835, filed Sep. 6, 2001, entitled "Compact Laser Package with Integrated Temperature Control," each of which is incorporated herein by reference.

BACKGROUND OF THE INVENTION

1. The Field of the Invention

The present invention relates generally to the manner of connecting a flexible circuit to adjacent electrical devices. More particularly, the present invention relates to the configuration of flexible circuits that connect electrical devices to a printed circuit board.

2. The Relevant Technology

Transceiver modules are widely used in the field of optoelectronics. Typically, a transceiver module includes a transmitter optical subassembly (TOSA) and a receiver optical subassembly (ROSA). Each of the TOSA and the ROSA may have an optical receptacle, for example a Lucent Connector (LC) cable receptacle or a Standard Connector (SC) cable receptacle, at one end, for attachment to an optical cable. They may also have a connector to provide an electrical connection to a printed circuit board at the other end. The entire transceiver module, in turn, connects to a computer system, such as a host system, for controlling the operation of the transceiver module. Thus, the computer system can direct the transceiver module to transmit an optical signal by directing an electronic signal through the printed circuit board and into the TOSA. The TOSA then generates an optical signal via an internal laser or light emitting diode (LED) and directs the optical signal into the outgoing optical cable. Similarly, the ROSA receives an optical signal via a photodiode from the incoming optical cable and transmits the signal to a printed circuit board and on to the computer system.

Providing an optimal connection between a TOSA and/or a ROSA and a printed circuit board, however, can be difficult. For example, positioning of the TOSA and the ROSA within the transceiver module must occur to small tolerances to achieve the desired optical performance. Similarly, precise alignment of the printed circuit board (PCB) relative to the TOSA and/or the ROSA must occur. Rigidly connecting the PCB to the TOSA and/or ROSA increases the difficulty with accurately positioning the devices difficult. Additionally, including the rigid connection can cause damage to the PCB, TOSA, and/or ROSA when the module experiences vibration and movement as optical cables are moved, attached and detached. Additionally, differential thermal contraction/expansion can also cause problems if the PCB rigidly connects to the TOSA and/or the ROSA.

To limit these problems, flexible circuits may be disposed between the TOSA and/or ROSA and the printed circuit board to electrically interconnect them while isolating the PCB from vibration or thermal expansion or contraction of the adjacent devices. The flexible circuit is additionally advantageous in that, during production, the PCB may be mechanically fixed in place while the TOSA and/or ROSA are not, or vice versa. Accordingly, a flexible circuit is frequently used to assemble the module so that variations in device subassembly position do not prevent precise connections and alignments from being made between the TOSA and/or ROSA and the printed circuit board.

Flexible circuits typically include a number of conductors or traces of conductive material that are bonded to or applied to a thin, flexible dielectric. Flexible circuits have a number of advantages when compared with other manners of connecting electrical components, such as the PCB to the TOSA and/or the ROSA. For instance, flexible circuits provide greater reliability than wire connections and eliminate the need for mechanical connectors, while reducing the possibility of wiring mistakes. Additionally, flexible circuits are typically lighter, require less space, provide higher circuit density, and are lower cost than other types of wire connections.

Although flexible circuits are beneficial, one of the difficulties associated with flexible circuit design is determining where to place the traces and components on the circuit. For instance, as optical devices such as TOSAs increase in performance and speed, additional conductive traces with different shapes and connectivity requirements are required. The number of such traces, as many as fifteen or more often exceeds the capacity for conventional flexible circuit designs to make contact with adjacent electronic devices. Additionally, both because devices are manufactured according to industry standards and due to the industry pressure for increasingly smaller devices, simply enlarging the size of a contact interface is not always an option.

Due to desired characteristics of flexible circuits, i.e., the flexible circuit is bendable, manufacturing processes require the inclusion of tooling holes to allow the flexible material to be fixed in place while the various components and traces are mounted on the circuit. Traditionally, these tooling holes are drilled somewhere in the middle of the flexible circuit. Unfortunately, this placement of a tooling hole eliminates space that could be used for the circuits or traces. As components become smaller and smaller, this space can be needed for additional circuitry as described above.

Accordingly, what is needed are novel devices and systems for improving the manufacturability of a flexible circuit while simultaneously providing the opportunity to increase circuit density of the flexible circuit.

SUMMARY OF EXEMPLARY EMBODIMENTS OF THE INVENTION

In general, exemplary embodiments of the invention are concerned with flexible circuit design. Exemplary embodiments of the present invention allow more traces, pads and/or components to be mounted on the flexible circuit by designing alternate tooling hole configurations.

According to one configuration of the invention, a flexible circuit includes a flexible substrate having first and second opposing surfaces. The flexible substrate can include multiple layers of dielectric, with a plurality of electrical traces and pads mounted on the flexible substrate. A plurality of electrical components can also be mounted on the flexible substrate.

One or more tooling cutouts are recessed in the sides of the flexible circuit. The tooling cutouts can have various shapes, such as, but not limited to, polygonal, curved, semi-circular, or other configurations that enables secure mounting of the flexible circuit during a manufacturing process or when the flexible circuit is mounted within a housing or casing of an optoelectronic device.

Flexible circuits according to the invention can conduct electrical, electrostatic, and electromagnetic signals from a first electronic device, such as a ceramic header assembly on a transmitter optical subassembly (TOSA) or a receiver optical subassembly (ROSA), to a second electronic device, such as a rigid or conventional printed circuit board. However, many other applications are possible, and are included within the scope of exemplary embodiments of the present invention.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE EXEMPLARY EMBODIMENTS

In general, embodiments of the invention are concerned with placement of tooling cutouts that allow more efficient usage of the flexible circuit's surface area than existing flexible circuits. By so doing, the flexible circuits of the present invention provide substantially the entire surface area on both sides of the flexible circuit to be used for electrical traces, pads, and components. This can occur through reducing and in some cases eliminating tooling cutouts from those areas of the flexible circuit where it would be advantageous to place electrical traces, pads, and components.

The flexible circuits according to exemplary embodiments of the invention can include a waveguide design (for example microstrip, coplanar waveguide, slotline, or the like) to confine and propagate electromagnetic waves along the flexible circuit. Generally, microstrips have an unbalanced transmission trace structure that includes a ground plane on the back side of a substrate, such as the dielectric of a flexible circuit, and a relatively narrow strip on the top side of the dielectric of a flexible circuit. Coplanar waveguides, as their name suggests, are formed on the planar surface of a dielectric of a flexible circuit with ground areas which parallel a signal trace on both sides of the signal trace. Although microstrip or coplanar waveguide designs can be used, generally any flexible circuit waveguide structure may be compatible with various aspects of the embodiments of the present invention.

Reference will now be made to FIGS. 1-3B to describe various aspects of exemplary embodiments of the invention. It is to be understood that the figures are diagrammatic and schematic representations of such exemplary embodiments, and are not limiting of the present invention, nor are they necessarily drawn to scale. In the following description, numerous specific details are set forth in order to provide a thorough understanding of the exemplary embodiments of the invention. It will be obvious, however, to one skilled in the art, that exemplary embodiments of the present invention may be practiced without these specific details. In other instances, well-known aspects of optical systems have not been described in particular detail in order to avoid unnecessarily obscuring the present invention.

Figure 1:
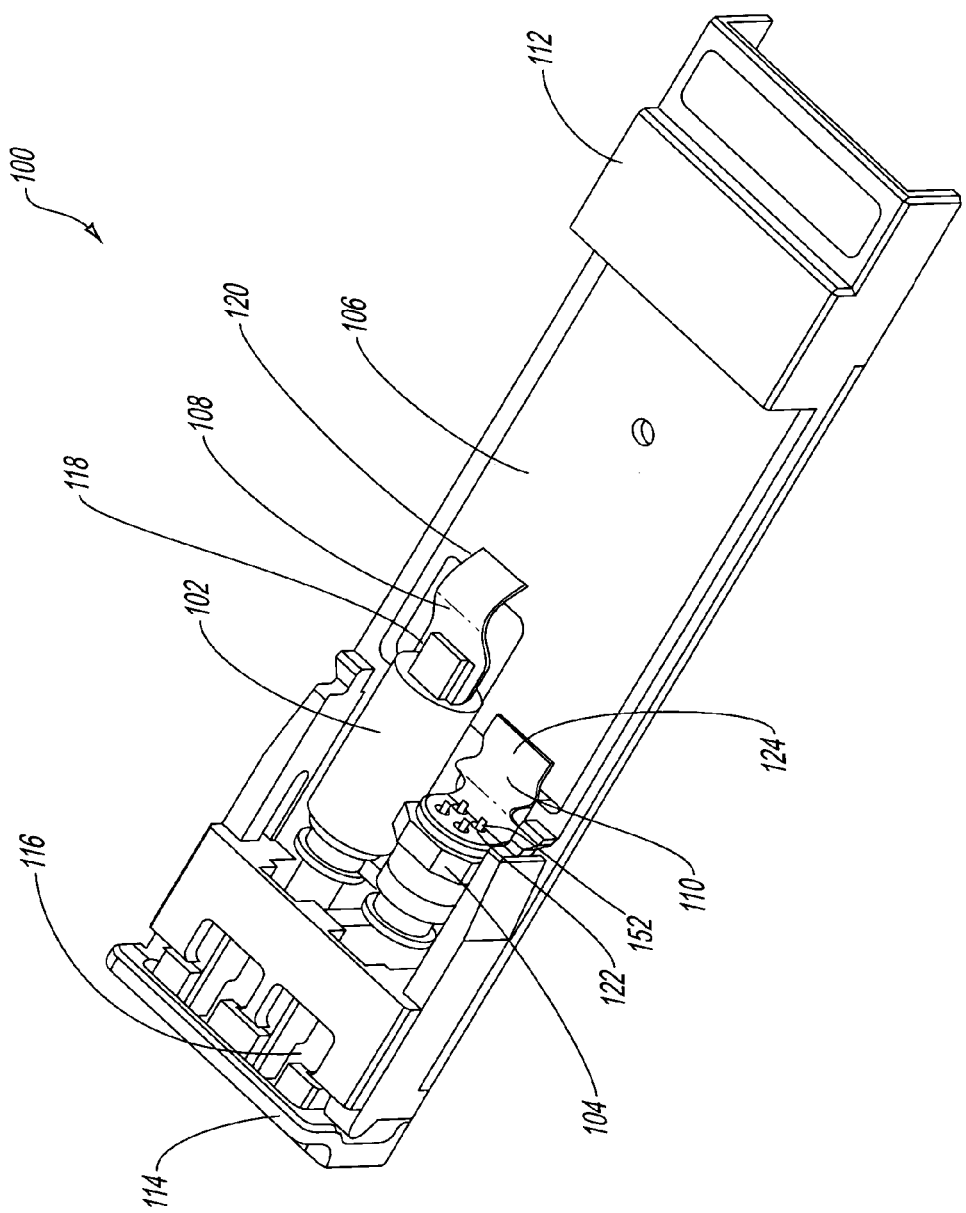
FIG. 1 is a schematic diagram that illustrates aspects of a transceiver module.

Reference is first made to FIG. 1, which illustrates a perspective view of a transceiver module, designated generally at 100. More specifically, the depicted module is an XFP transceiver module, which is a 10-Gigabit Small Form-Factor Pluggable Module for use in telecommunications networks, local area networks, metropolitan area networks, storage area networks, wide area networks, and the like. XFP transceivers are designed to occupy one-fifth of the space and use one-half the power of prior 10 Gb/s modules.

In addition, the depicted module may include a temperature-compensated externally modulated laser (EML) for use in dense wavelength division multiplexing applications (DWDM) and therefore be more completely described as a DWDM EML XFP transceiver module. The transceiver modules constructed according to the invention can be compatible with the XFP MSA standards, for example, including those set forth in the 10 Gigabit Small Form Factor Pluggable Module adoption draft specification Revision 2.0 published by the XFP Multi Source Agreement (MSA) Group on Dec. 16, 2002 (xfpmsa.org), which is incorporated herein by reference. However, the specific designs illustrated for flexible circuits are not limited to XFP modules, and can be used in any application where flexible circuits can be used.

As depicted in FIG. 1, XFP transceiver module 100 includes TOSA 102, ROSA 104, printed circuit board 106, first flexible circuit 108 and second flexible circuit 110. For ease of discussion the various components typically mounted to printed circuit board 106 have been omitted.

First flexible circuit 108 interconnects TOSA 102 and printed circuit board 106 while second flexible circuit 110 interconnects ROSA 104 and printed circuit board 106. Also depicted as part of module 100 are housing 112 for containing the electrical components of module 100, bail release 114, and Lucent Connector (LC) cable receptacles 116 for receiving and securely attaching LC cables to TOSA 102 and ROSA 104. In the illustrated embodiment of FIG. 1, first flexible circuit 108 connects to TOSA 102 at first interface 118 and connects to printed circuit board 106 at second interface 120.

TOSA 102 can be an EML TOSA. Of course, one skilled in the art will recognize that other TOSA assemblies can also be used. Examples of such assemblies can include features such as a ceramic header TOSA, a distributed feedback laser, a vertical cavity surface emitting laser (VCSEL), an uncooled EML, a cooled electroabsorbtive modulated laser, an EML with a wavelocker, and the like.

ROSA 104 can include, for example, an avalanche photodiode (APD). An APD is a conventional device that operates with a reverse-bias voltage that causes the primary photocurrent to undergo amplification by cumulative multiplication of charge carriers. With continued reference to FIG. 1, ROSA 104 attaches to second flexible circuit 110 at a third interface 122 via a TO-Header soldered pin interface. Second flexible circuit 110 connects to printed circuit board 106 at fourth interface 124.

Although the depicted flexible circuits connect to one or more of a TOSA, a ROSA, these exemplary embodiments. Rather, the flexible circuit designs disclosed herein may be compatibly incorporated into any design wherein a flexible circuit connects to an adjacent device.

Figure 2A:
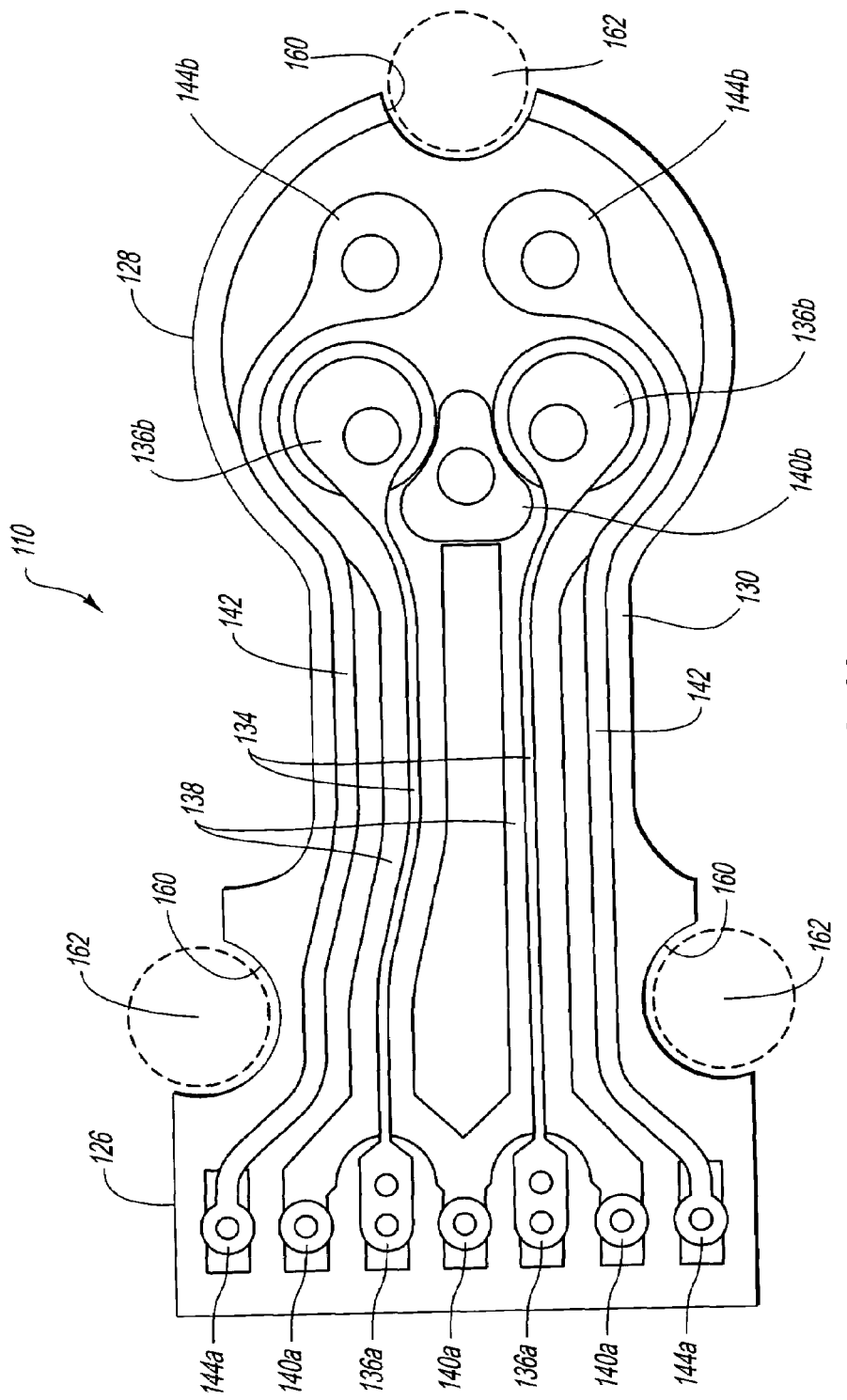
FIGS. 2A and 2B are schematic diagrams that illustrate aspects of a flexible circuit according to exemplary embodiments of the invention.
Figure 2B:
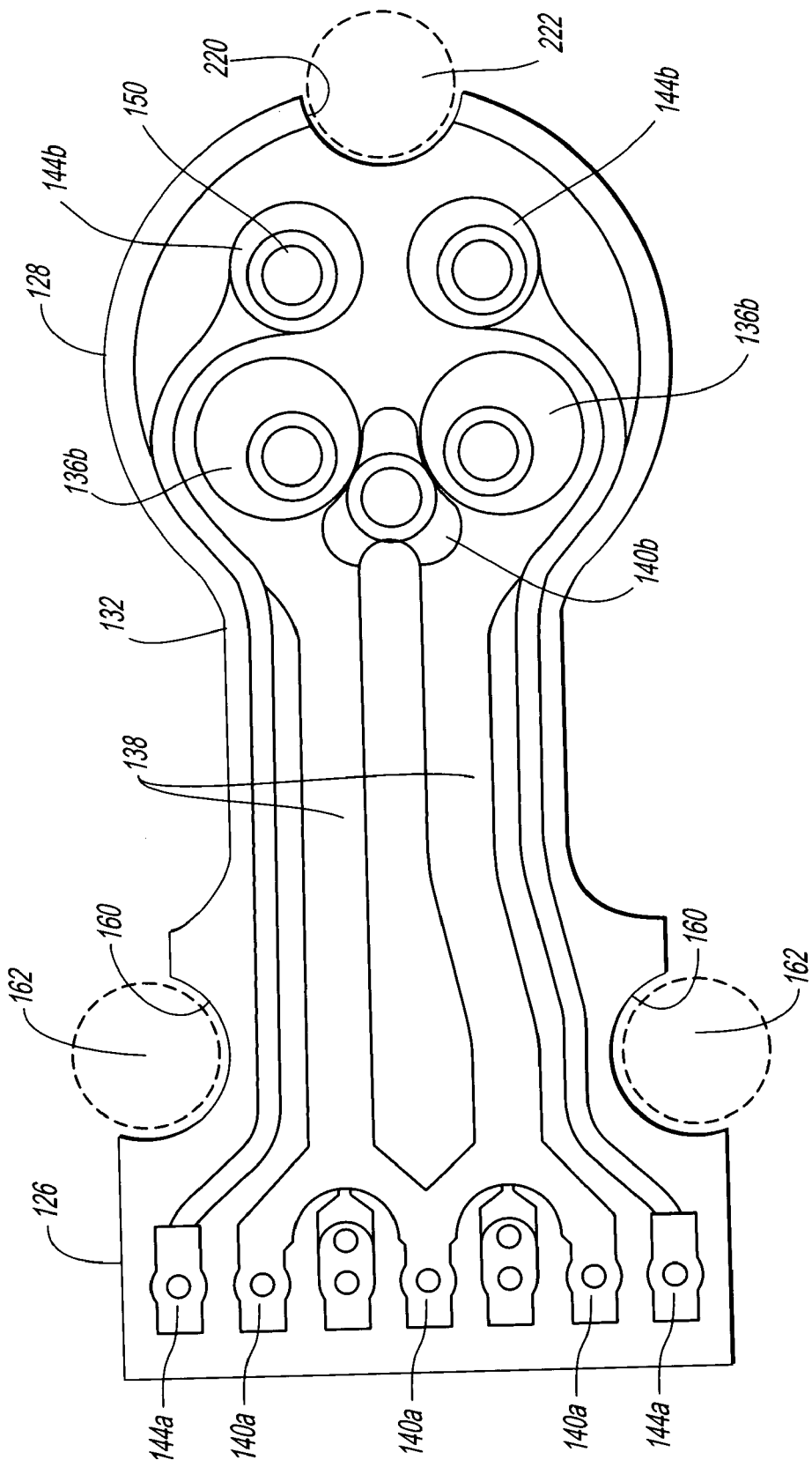

FIGS. 2A and 2B illustrate an exemplary embodiment of flexible circuit 110. Although discussion will be made to various structures and aspects of flexible circuit 110, which connects ROSA 104 to PCB 106, one skilled in the art will understand that the general aspects of flexible circuit 110 can apply to other flexible circuits that connect other optoelectronic components, electrical components, and circuits.

FIGS. 2A and 2B illustrate opposing views of first side 130 and second side 132 of flexible circuit 110. Flexible circuit 110 includes an end 126 and another end 128. The end 126 can connect to PCB 106 at forth interface 124, while end 128 can connect to ROSA 104 at third interface 122.

To aid with making the electrical connection between ROSA 104 and PCB 106 flexible circuit 110 includes high speed data traces 134, with associated high speed data pads 136a, 136b, and low speed data traces 142, with associated low speed data pads 144a, 144b. Additionally, flexible circuit 110 can include ground traces 138, with ground pads 140a, 140b, to provide an electrical ground for ROSA 104 and PCB 106.

In the illustrated configuration, pads 136a, 140a, 144a are in a substantially linear array at end 126 of flexible circuit 110. These pads 136a, 140a, and 144a provide the structures to facilitate electrical connection between PCB 106 and flexible circuit 110. Although a linear array is illustrated, one skilled in the art will understand of the possibility of a non-linear configuration of pads 136a, 140a, and 144a.

Disposed at end 128 of flexible circuit 110, which connects to ROSA 104 in the illustrated configuration, conventional openings 150 are formed to engage, mate, or receive conductive pins 152 (FIG. 1) on ROSA 104. In one configuration, a soldering process completes the joining of flexible circuit 110 to ROSA 104 at interface 122 (FIG. 1). Solder fillets (not shown) can be formed in the areas where pads 136b, 140b, and 144b substantially exceed the diameter of opening 150, since there are cover layer openings there. Optionally, ground trace 138 can be relieved around pads 136b, 140b, and 144b to minimize parasitic capacitance, and thin high speed data trace 134 can be flared to prevent trace breakage. There can also be an integrated Kapton stiffening washer (not shown) bonded to end 128 of flexible circuit 110 to prevent flexing in the solder region and to thus prevent trace and solder joint breakage.

Although traces 134, 138, and 142 and pads 136a, 136b, 140a, 140b, 144a, and 144b are illustrated mounted on flexible circuit 110, it is understood that many other types of electrical components can also be included on flexible circuit 110. For instance, other electrical components can include, but not limited to, resistors, capacitors, chips, dies, and other types of electrical components that can be used in any capacity in an electrical circuit.

Generally, flexible circuit 110 can be a patterned arrangement of printed wiring utilizing flexible base material with or without flexible cover layers. In general, flexible circuits are produced in several basic forms that generally parallel printed circuit board constructions. These include, for example, single-sided flexible circuits, double-sided flexible circuits, multilayer flexible circuits (having three or more conductor layers), and rigid flexible circuits.

Flexible circuits can be manufactured using a variety of materials, such as polyimide, polyester, LCP, Teflon, and the like. Embodiments of the invention use a material to form the core layer of the flexible circuit to accommodate the density of electrical traces and pads thereon. Such materials may include, by way of example only, DuPont Pyralux® AP-8525 and DuPont Kapton® E. For example, DuPont Pyralux® AP-8525 is a double-sided, copper-clad laminate and is an all-polyimide composite of polyimide film bonded to copper foil.

As shown in FIGS. 2A and 2B, flexible circuit 110 includes a plurality of tooling cutouts 160. These cutouts 160 cooperate with production machinery to facilitate secure holding and manipulation of flexible circuit 110 using, for example, a plurality of guide pins 162 (shown in phantom), during manufacture of circuit 110 and during assembly of transceiver module 100 (FIG. 1). As shown, one cutout 160 is disposed at second end 128, while two cutouts 160 are disposed distal to end 126. By so doing, flexible circuit 110 is prevented from moving laterally and rotationally relative to guide pins 162 (shown in phantom). The tooling cutouts 160 can be placed anywhere along the periphery or perimeter of flexible circuit 110 so that cooperation of guide pins 162 (shown in phantom) and cutouts 160 prevent lateral and rotational movement during production. As such, the positions shown in FIGS. 2A and 2B are by way of example only and should not be construed to limit the exemplary embodiments of the invention in any way. In other configurations, one or more cutouts 160 can be formed at end 126, at end 128, and at any location intermediate of end 126 and end 128 so that the cutouts 160 can form recesses in the perimeter of flexible circuit 110.

Tooling cutouts 160 are shown as being approximately semicircular. However, this need not be the case. One skilled in the art will realize that a cutout that creates an arc or curve either larger or smaller than a semicircle also falls within the scope of the exemplary embodiments. Additionally, cutouts can have the configuration of complete or portions of or shapes. For instance, cutouts can be oval, polygonal, square, triangular, rectangular, etc. More generally, any cutout configuration that includes one or more curved sides and/or two or more straight sides are contemplated to be within the scope of the exemplary embodiments of the invention. Further, cutout can have any configuration that engages, mates, or receives pins or other structures associated with manufacturing, test, or other machinery used during production of a flexible circuit or an optoelectronic device. The specific advantages of tooling cutouts versus tooling holes will be discussed below with reference to FIGS. 3A and 3B.

Figure 3A:
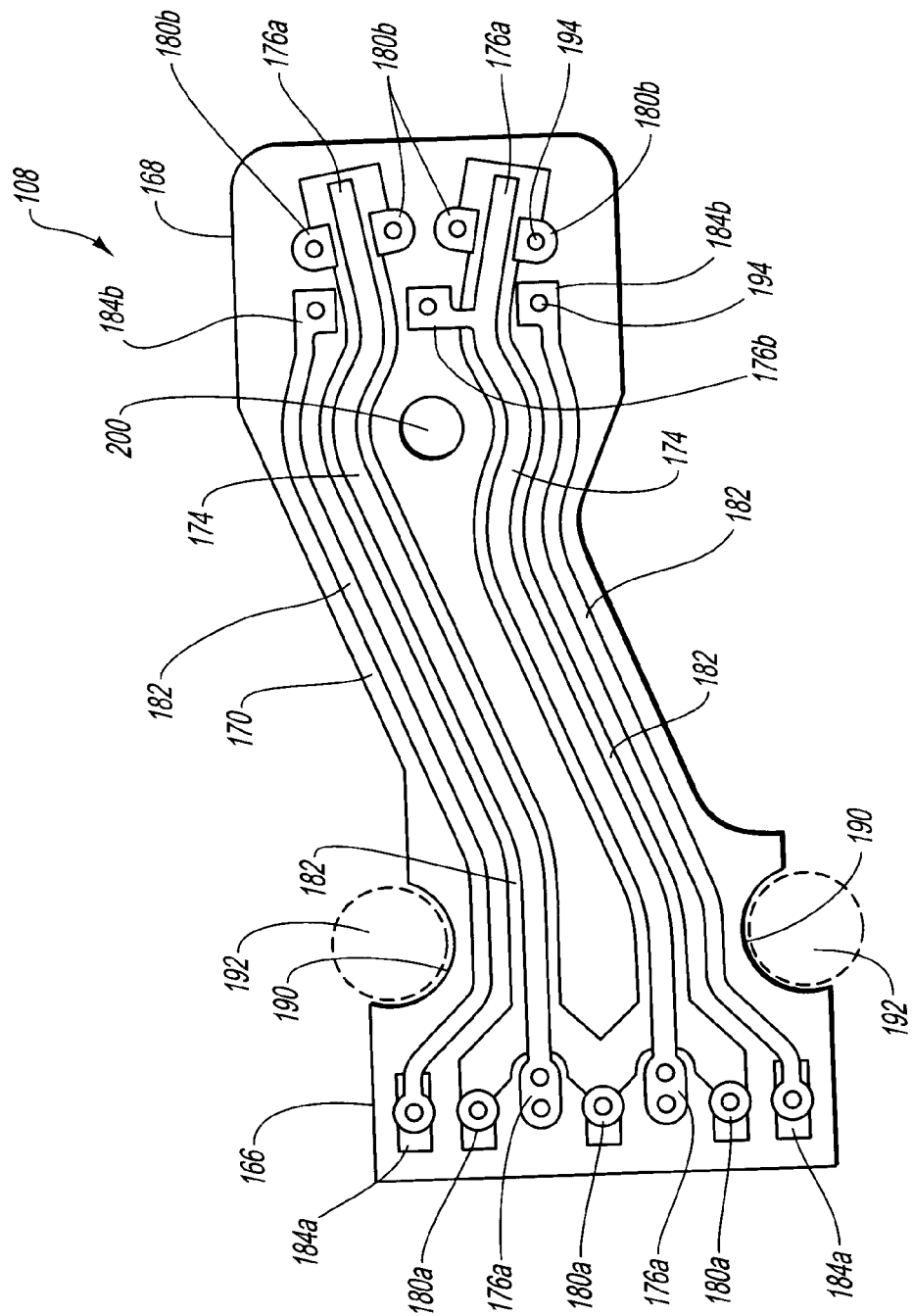
FIGS. 3A and 3B are further schematic diagrams that illustrate aspects of a flexible circuit according to an alternate exemplary embodiment.
Figure 3B:
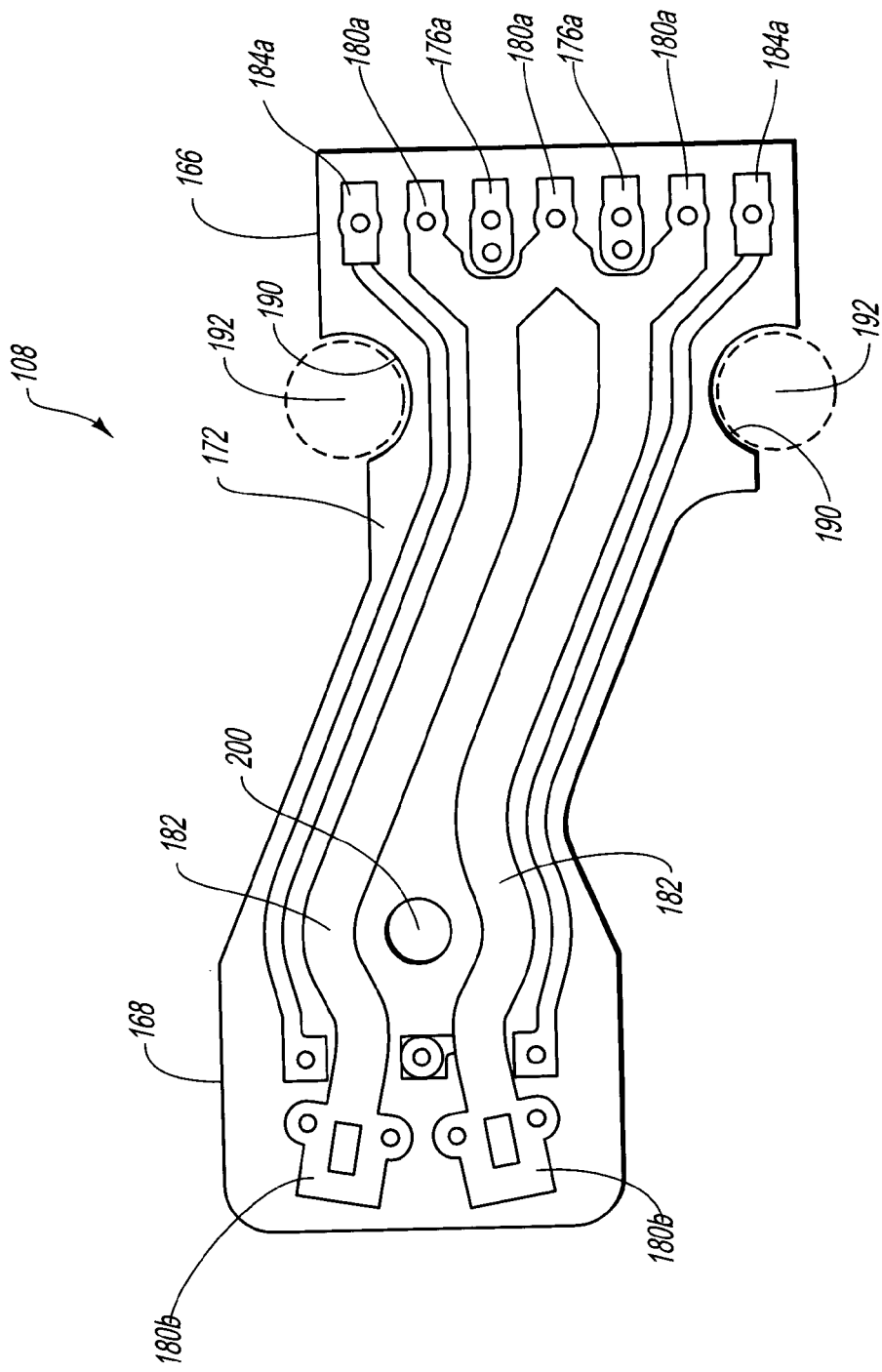

Reference is now made to FIGS. 3A and 3B collectively, which illustrate opposing views of a first side 170 and a second side 172 of one exemplary embodiment of a flexible circuit 108. Although discussion will be made to various structures and aspects of flexible circuit 108, which connects TOSA 102 to PCB 106, one skilled in the art will understand that the general aspects of flexible circuit 108 can apply to other flexible circuits that connect other optoelectronic components, electrical components, and circuits. Further, the various configurations, attachment methods and techniques, and materials described with respect to flexible circuit 110 also apply to flexible circuit 108.

Flexible circuit 108 includes an end 166 and another end 168. The end 166 can connect to PCB 106 at second interface 120, while end 168 can connect to TOSA 102 at first interface 118. To aid with making the electrical connection between TOSA 102 and PCB 106 flexible circuit 108 includes high speed data traces 174, with associated high speed data pads 176a, 176b, and low speed data traces 182, with associated low speed data pads 184a, 184b. Additionally, flexible circuit 108 can include ground traces 178, with ground pads 180a, 180b, to provide an electrical ground for TOSA 102 and PCB 106.

In the illustrated configuration, pads 176a, 180a, 184a are in a substantially linear array at end 166 of flexible circuit 108. These pads 176a, 180a, and 184a provide the structures to facilitate electrical connection between PCB 106 and flexible circuit 108. Although a linear array is illustrated, one skilled in the art will understand of the possibility of a non-linear configuration of pads 176a, 180a, and 184a.

With continued reference to FIG. 3A, flexible circuit 108 also includes tooling cutouts 190 that function in a similar manner to and can have similar configurations to cutouts 160. For instance, cutouts 190 enable production machinery to hold and manipulate flexible circuit 108 using, for example, guide pins 192 (shown in phantom), during manufacture of circuit 108 and during assembly of transceiver module 100 (FIG. 1). Removing tooling holes from within flexible circuit 108 allows additional electrical components to be mounted on flexible circuit 108. As with flexible circuit 110, the placement of the tooling holes on flexible circuit 108 is shown by way of example only. Tooling cutouts 190 can be placed anywhere along the periphery of flexible circuit 108 or at any other location as described with respect to flexible circuit 110.

The tooling cutouts 190, and so cutouts 160 (FIG. 2A) of flexible circuit 110 (FIG. 2A), provide some distinct advantages over tooling holes placed at some location between the peripheral edges of a flexible circuit. Using cutouts located on a periphery of the flexible circuit eliminates the need to design the various components and traces on the flexible circuit around the tooling holes, which is the case when the holes are located within the flexible material. This situation is shown by way of example only using reference numeral 200 to designate a tooling hole in the middle of the flexible circuit. As shown, the various traces must be routed around tooling hole 200. This leaves a reduced amount of space for the required traces and/or electrical components when compared with the present invention that utilizes peripherally positioned tooling holes. Eliminating this centrally located tooling hole allows the components and traces used in the circuit to be more evenly spaced, and spaced farther apart. Since the closer the components, the more expensive the circuit, spacing the components farther apart provides a less expensive circuit. Additionally, since tooling cutouts 190, and so cutouts 160 (FIG. 2A) of flexible circuit 110 (FIG. 2A), are not actually holes, it is easier to align flexible circuit 108 within the various manufacturing machinery used to make and test the circuits, as well as in a final operational configuration.

While the specific embodiments of flexible circuits shown in FIGS. 2A, 2B, 3A and 3B are designed, respectively, to interconnect a ROSA or a TOSA with a printed circuit board, any other application for a flexible circuit is also contemplated to fall within the scope of the exemplary embodiments. Such an application can be found in co-pending U.S. patent application Ser. No. 10/835,832, filed on Apr. 3, 2004 and entitled "Optoelectronic Module Having Double Sided Flexible Circuit", which is incorporated herein by reference.

Additionally, the specific location of pads and traces is arbitrary. Any combination of pads, traces, and other electronic components on a flexible circuit is contemplated to fall within the scope of the present invention.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A flexible circuit comprising:
   a flexible substrate;
   a plurality of electrical traces mounted on said flexible substrate; and
   at least one tooling cutout recessed in a peripheral edge of said flexible circuit, the at least one tooling cutout having a shape that is configured to engage an outer surface of at least one guide pin to substantially limit lateral and rotational movement of the flexible circuit when at least partially secured by the at least one tooling cutout to at least one other device, wherein the shape of the at least one tooling cutout is defined by a shape of an outer periphery of each of the at least guide pin, wherein one of the tooling cutouts is disposed at a first end of the flexible circuit where the plurality of electrical traces of the flexible circuit electrically connect to an optical subassembly.

2. A flexible circuit as recited in claim 1, wherein the substrate comprises one or more layers.

3. A flexible circuit as recited in claim 1, wherein a first of said at least one tooling cutout is located at a first end of said flexible substrate and a second of said at least one tooling cutout is located at a second end of said flexible substrate.

4. A flexible circuit as recited in claim 1, wherein a first of said at least one tooling cutout is located between a first end and a second end of said flexible substrate and a second of said at least one tooling cutout is located at said second end of said flexible substrate.

5. A flexible circuit as recited in claim 1, wherein a first of said tooling cutouts is located on a first edge of said flexible substrate and a second of said tooling cutouts is located on a second edge of said flexible substrate.

6. A flexible circuit as recited in claim 1, wherein said at least one tooling cutout is semicircular.

7. A flexible circuit as recited in claim 1, wherein said at least one tooling cutout has a predefined geometric shape configured to detachably engage with a corresponding structure of the at least one guide pin.

8. A flexible circuit as recited in claim 7, wherein the predefined geometric shape is curved.

9. A flexible circuit according to claim 1, wherein the first end is at an opposite end of the flexible circuit from a second end, wherein the second end of the flexible circuit includes electrical connection pads configured to electrically connect to a printed circuit board (PCB).

10. A flexible circuit according to claim 9, wherein two of the tooling cutouts are disposed along opposing sides of the flexible circuit between the first and second ends of the flexible circuit.

11. A flexible circuit according to claim 10, wherein the two of the tooling cutouts disposed along opposing sides of the flexible circuits are located closer to the second end of the flexible circuit than to the first end of the flexible circuit.

12. An apparatus comprising:

a transmitter optical subassembly (TOSA);

a receiver optical subassembly (ROSA);

a printed circuit board (PCB);

a first flexible substrate electrically connecting the TOSA to the PCB;

a second flexible substrate electrically connecting the ROSA to the PCB;

a plurality of traces mounted on said first flexible substrate;

a plurality of traces mounted on said second flexible substrate;

a plurality of guide pins; and a plurality of tooling cutouts formed in a perimeter of said first and second flexible substrates, the plurality of tooling cutouts being configured to cooperate with the plurality of guide pins to substantially limit lateral and rotational movement of the flexible substrates relative to the plurality of guide pins when the first and second flexible substrates are at least partially secured to the PCB.

13. An apparatus as recited in claim 12, wherein the first and second substrates comprise one or more layers.

14. An apparatus as recited in claim 12, wherein a first of said tooling cutouts is located on a first edge of said first flexible substrate and a second of said tooling cutouts is located on a second edge of said first flexible substrate.

15. An apparatus as recited in claim 14, wherein said tooling cutouts are semicircular.

16. An apparatus as recited in claim 14, wherein said tooling cutouts have a plurality of straight sides.

17. An apparatus as recited in claim 14, wherein said tooling cutouts have a plurality of curved sides.

18. An apparatus as recited in claim 12, wherein a first of said tooling cutouts is located on a first edge of said first flexible substrate, a second of said tooling cutouts is located on a second edge of said first flexible substrate, and a third of said tooling cutouts is located on a third edge of said first flexible substrate.

19. An apparatus according to claim 12, wherein the plurality of traces on each flexible substrate include a low speed data trace, a high speed data trace, and a ground trace.

20. An apparatus according to claim 12, wherein the guide pins have a circular cross-sectional shape and the tooling cutouts have a semi-circular cross sectional shape, wherein the tooling cutouts extend about half of the way around the guide pins when the first and second flexible substrates are at least partially secured to the PCB.

21. An apparatus a according to claim 20, wherein the first and second flexible substrates each include at least three tooling cutouts, wherein each of the tooling cutouts is disposed on an opposite side of the first and second flexible substrates.

22. An apparatus according to claim 12, wherein one of the tooling cutouts is disposed at an end of the second flexible circuit where the plurality of traces of the second flexible circuit electrically connect to the ROSA.

* * * * *

UNITED STATES PATENT AND TRADEMARK OFFICE
CERTIFICATE OF CORRECTION

PATENT NO. : 7,446,261 B2
APPLICATION NO. : 10/835832
DATED : November 4, 2008
INVENTOR(S) : Kumar et al.

Page 1 of 3

It is certified that error appears in the above-identified patent and that said Letters Patent is hereby corrected as shown below:

Drawings
Sheet 3, replace Figure 2B with the figure depicted below, wherein "220" and "222" have been changed to --160-- and --162-- respectively, and --110-- has been added

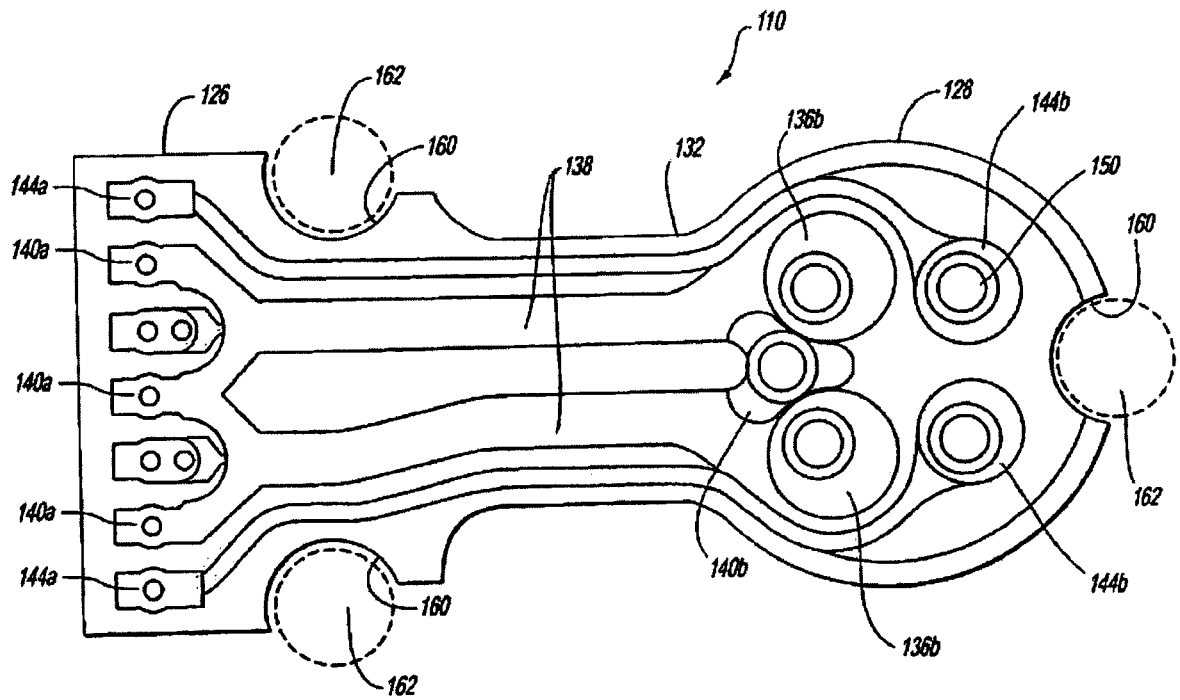

FIG. 2B

Signed and Sealed this
Fourteenth Day of August, 2012

David J. Kappos
*Director of the United States Patent and Trademark Office*

CERTIFICATE OF CORRECTION (continued)

U.S. Pat. No. 7,446,261 B2

Sheet 4, replace Figure 3A with the figure depicted below, wherein the ground traces "182" have been changed to --178--, and the items [194] have been removed

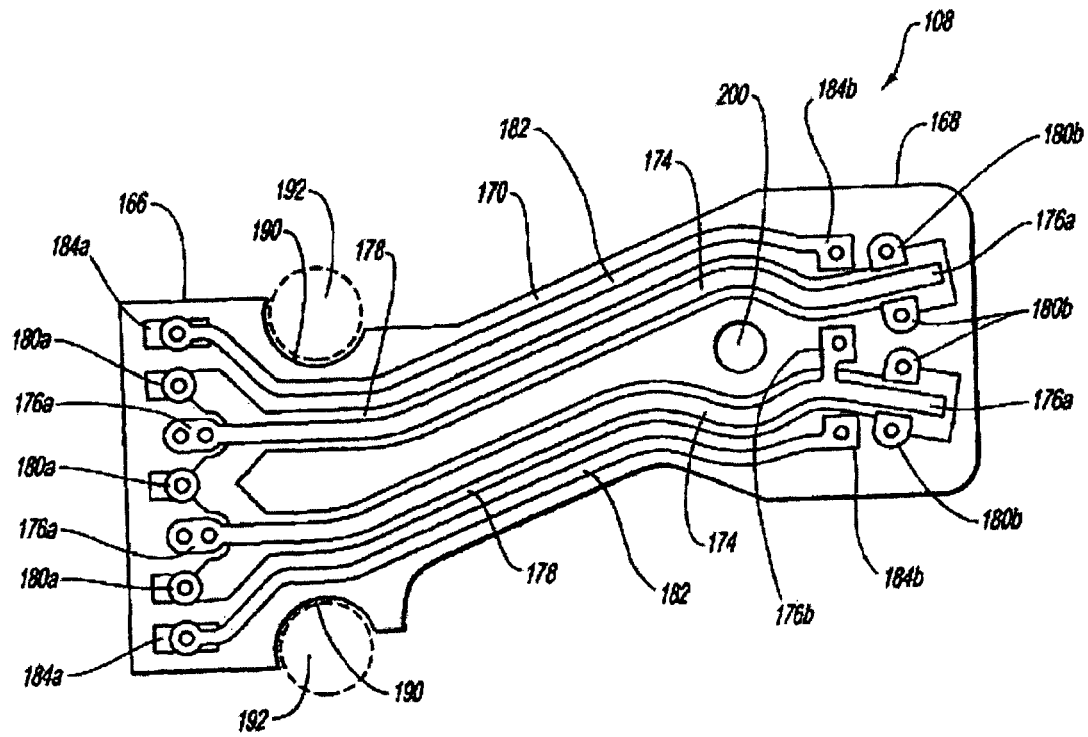

FIG. 3A

Column 1
Line 63, after "devices", remove [difficult]

Column 3
Line 4, change "enables" to --enable--

Column 5
Line 13, after "ROSA,", add --and a printed circuit board, flexible circuits according to the invention are not limited solely to--
Line 27, change "forth" to --fourth--
Lines 53 and 55, change "trace" to --traces--

Column 6
Line 25, change "of circuit 110" to --of flexible circuit 110--
Line 46, after "portions of", remove [or]
Line 51, after "Further,", add --the--
Line 54, change "test," to --testing--

Column 7
Line 7, after "PCB 106", add --,--
Line 27, change "circuit 108" to --flexible circuit 108--

Column 8
Lines 24-25, change "at least guide pin," to --at least one guide pin,--